United States Patent
Kim et al.

(10) Patent No.: US 9,472,624 B2
(45) Date of Patent: Oct. 18, 2016

(54) SEMICONDUCTOR BUFFER STRUCTURE, SEMICONDUCTOR DEVICE INCLUDING THE SAME, AND MANUFACTURING METHOD THEREOF

(71) Applicant: Samsung Electronics Co., Ltd., Suwon-Si, Gyeonggi-Do (KR)

(72) Inventors: Jun-youn Kim, Hwaseong-si (KR); Joo-sung Kim, Seongnam-si (KR); Moon-seung Yang, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 447 days.

(21) Appl. No.: 13/837,460

(22) Filed: Mar. 15, 2013

(65) Prior Publication Data

US 2014/0061663 A1 Mar. 6, 2014

(30) Foreign Application Priority Data

Sep. 4, 2012 (KR) ........................ 10-2012-0097863

(51) Int. Cl.
*H01L 29/20* (2006.01)
*H01L 21/02* (2006.01)
*H01L 29/267* (2006.01)

(52) U.S. Cl.
CPC ....... *H01L 29/2003* (2013.01); *H01L 21/0251* (2013.01); *H01L 21/0254* (2013.01);
(Continued)

(58) Field of Classification Search
CPC .................. H01L 21/02458; H01L 21/0254; H01L 21/2003; H01L 21/02505; H01L 21/02507; H01L 21/0251; H01L 21/02304; H01L 33/12

USPC .......... 257/76, 194; 438/142, 336, 446, 478, 438/689, 697, 698; 8/76, 194
See application file for complete search history.

(56) References Cited

U.S. PATENT DOCUMENTS 5,929,466 A * 7/1999 Ohba .................... H01L 29/201
257/103
6,242,764 B1 6/2001 Ohba et al.
(Continued)

FOREIGN PATENT DOCUMENTS

JP       3606015 B2    1/2005
JP     2011044669 A    3/2011
(Continued)

OTHER PUBLICATIONS

Schenk et al., "Growth of thick, continuous GaN layers on 4-in. Si substrates by metalorganic chemical vapor deposition," Journal of Crystal Growth, Elsevier, Amsterdam, NL, vol. 314, No. 1, Jan. 1, 2011, pp. 85-91, XP027583458, ISSN: 0022-0248.

*Primary Examiner* — Jerome Jackson, Jr.
*Assistant Examiner* — David Spalla
(74) *Attorney, Agent, or Firm* — Harness, Dickey & Pierce, P.L.C.

(57) ABSTRACT

A semiconductor structure including a first nitride semiconductor layer, a second nitride semiconductor layer, and a third layer between the first nitride semiconductor layer and the second nitride semiconductor layer. The first nitride semiconductor layer has a first gallium composition ratio, the second nitride semiconductor layer has a second gallium composition ratio different from the first metal composition ratio, and the third layer has a third gallium composition ratio greater than at least one of the first gallium composition ratio or the second gallium composition ratio. The structure may also include a fourth layer for reducing tensile stress or increasing compression stress experienced by at least the second nitride semiconductor layer.

21 Claims, 6 Drawing Sheets

(52) U.S. Cl.
CPC ... *H01L21/02381* (2013.01); *H01L 21/02458* (2013.01); *H01L 21/02505* (2013.01); *H01L 21/02507* (2013.01); *H01L 29/267* (2013.01)

(56) References Cited

U.S. PATENT DOCUMENTS

| | | | |
|---|---|---|---|
| 6,649,287 B2* | 11/2003 | Weeks et al. | 428/698 |
| 7,115,896 B2* | 10/2006 | Guo et al. | 257/15 |
| 7,273,798 B2* | 9/2007 | Lester et al. | 438/458 |
| 7,598,108 B2* | 10/2009 | Li et al. | 438/48 |
| 7,687,888 B2 | 3/2010 | Marchand et al. | |
| 8,134,168 B2* | 3/2012 | Sakai | H01L 21/0237 257/190 |
| 2005/0269575 A1* | 12/2005 | Peng | H01L 21/02381 257/79 |
| 2009/0008647 A1 | 1/2009 | Li et al. | |
| 2009/0236634 A1* | 9/2009 | Moriya et al. | 257/190 |
| 2011/0266522 A1* | 11/2011 | Kim et al. | 257/22 |
| 2012/0223365 A1* | 9/2012 | Briere | H01L 21/0237 257/194 |

FOREIGN PATENT DOCUMENTS

| | | |
|---|---|---|
| KR | 20060112228 A | 10/2006 |
| KR | 20070017751 A | 2/2007 |
| KR | 20080001844 A | 1/2008 |
| KR | 20090081693 A | 7/2009 |
| KR | 20090115826 A | 11/2009 |
| KR | 20100059776 A | 6/2010 |
| KR | 101037496 B1 | 5/2011 |
| KR | 20110081331 A | 7/2011 |
| KR | 20120032329 A | 4/2012 |
| WO | WO 02/48434 A2 | 6/2002 |
| WO | WO 02/48434 A3 | 6/2002 |

* cited by examiner

SEMICONDUCTOR BUFFER STRUCTURE, SEMICONDUCTOR DEVICE INCLUDING THE SAME, AND MANUFACTURING METHOD THEREOF

CROSS-REFERENCE TO RELATED APPLICATIONS

This application claims the benefit of Korean Patent Application No. 10-2012-0097863, filed on Sep. 4, 2012, in the Korean Intellectual Property Office, the disclosure of which is incorporated herein in its entirety by reference.

BACKGROUND

1. Field

One or more embodiments herein relate to a semiconductor buffer structure, a semiconductor device including the semiconductor buffer structure, and a method of manufacturing the semiconductor buffer structure and the semiconductor device.

2. Description of the Related Art

Many nitride-based semiconductor devices use sapphire substrates that are expensive, hard to process, and have low electric conductivity. Also, when a sapphire substrate is epitaxially grown to a large size, the substrate may warp at high temperatures due to a low thermal conductivity. Consequently, it is difficult to make sapphire substrates large in size.

Semiconductor devices which use silicon substrates have been proposed in order to avoid some of these drawbacks. Because silicon has a higher thermal conductivity than sapphire, a substrate made of silicon will not bend as much even at temperatures required for growing nitride thin films. Accordingly, silicon substrates may be more suitable for making large devices that use nitride thin films.

However, the approach of using silicon substrates in nitride-based devices is not without drawbacks. For example, when a nitride buffer structure is grown on a silicon substrate, dislocation density may increase due to a mismatch in a gallium composition ratio between the substrate and the nitride buffer structure. This mismatch may promote the formation of cracks, which can compromise proper operation of the device or, in a worst case, render the device inoperative.

SUMMARY

In accordance with one embodiment, a semiconductor buffer structure includes a plurality of nitride semiconductor layers with increasing average gallium composition ratios, and a dislocation control layer disposed between neighboring nitride semiconductor layers from among the plurality of nitride semiconductor layers. The dislocation control layer is made of a material which includes $Al_{a1}In_{b1}G_{1-a1-b1}N$ ($0 \leq a1 < 1$, $0 \leq b1 < 1$, $a1+b1 \neq 1$).

In one implementation, an average gallium composition ratio of the dislocation control layer may be higher than an average gallium composition ratio of each of a plurality of neighboring nitride semiconductor layers. Additionally, or alternatively, an average gallium composition ratio of the dislocation control layer may be higher than a gallium composition ratio of each of a plurality of neighboring nitride semiconductor layers at a boundary between the dislocation control layer and the neighboring nitride semiconductor layers.

The dislocation control layer may be a single crystal layer, and/or may include GaN. Moreover, the dislocation control layer may have a thickness which allows a compression stress to be formed in the plurality of nitride semiconductor layers and the dislocation control layer. In one implementation, a thickness of the dislocation control layer may be less than a thickness of each of the neighboring nitride semiconductor layers. According to one example, the dislocation control layer may have a thickness in a range between about 0.1 nm and about 100 nm.

Additionally, the dislocation control layer may contact at least one of the neighboring nitride semiconductor layers. Also, a layer of the plurality of nitride semiconductor layers contacting a silicon substrate may be formed of AlN, and/or a layer of the plurality of nitride semiconductor layers spaced farthest apart from a silicon substrate may be formed of GaN.

Additionally, the semiconductor buffer structure may include a stress control layer disposed on the dislocation control layer, formed of $Al_{a2}In_{b2}G_{1-a2-b2}N$ ($0 < a2 \leq 1$, $0 \leq b2 \leq 1$, $a2 \neq a1$), and compensating for a reduction in a compression stress of the semiconductor buffer structure.

Additionally, an average gallium composition ratio of the stress control layer may be lower than an average gallium composition ratio of each of the neighboring nitride semiconductor layers. Also, an average aluminum composition ratio of the stress control layer may be higher than an average aluminum composition ratio of each of the neighboring nitride semiconductor layers.

Additionally, the stress control layer may be disposed between a first nitride semiconductor layer having a high average gallium composition ratio from among the neighboring nitride semiconductor layers and the dislocation control layer.

Additionally, a gallium composition ratio of the stress control layer in a boundary between the stress control layer and the dislocation control layer may be lower than a gallium composition ratio of a nitride semiconductor layer having a low average gallium composition ratio from among the neighboring nitride semiconductor layers in a boundary between the nitride semiconductor layer and the dislocation control layer.

Additionally, the stress control layer may be a single crystal layer, and/or the stress control layer may be formed of AlN. A thickness of the stress control layer may be a thickness in such a way that a compression stress is formed in the plurality of nitride semiconductor layers, the dislocation control layer, and the stress control layer. Also, a thickness of the stress control layer may be less than a thickness of the dislocation control layer, and in one implementation the thickness of the dislocation control layer may be between about 10 nm and about 2000 nm, and the thickness of the stress control layer is between about 1 nm and about 1000 nm. The increase may be, for example, a stepwise increase.

Additionally, the semiconductor buffer structure may include a silicon substrate, wherein the plurality of nitride semiconductor layers are disposed on the silicon substrate. One direction may be a direction far away from the silicon substrate.

In accordance with another embodiment, a semiconductor buffer structure includes a plurality of nitride semiconductor layers having an average gallium composition ratio increasing in one direction; and an dislocation control layer disposed in one or more nitride semiconductor layers from among the plurality of nitride semiconductor layers, to reduce an overall dislocation density of the plurality of nitride semiconductor layers, wherein the dislocation control layer is formed of $Al_{a1}In_{b1}Ga_{1-a1-b1}N$ ($0 \leq a1 < 1$, $0 \leq b1 < 1$, $a1+b1 \neq 1$). The plurality of nitride semiconductor layers may be three or more layers.

In accordance with another embodiment, a semiconductor device includes any of the aforementioned embodiments of the semiconductor buffer structure and a nitride stack structure formed on the semiconductor buffer structure. The semiconductor device may further include a device layer formed on the nitride stack structure. The device layer may include a light-emitting diode (LED), a laser diode (LD), a field effect transistor (FET), a high electron mobility transistor (HEMT), or a Schottky diode.

In accordance with another embodiment, a semiconductor structure includes a first nitride semiconductor layer, a second nitride semiconductor layer, and a third layer between the first nitride semiconductor layer and the second nitride semiconductor layer. The first nitride semiconductor layer has a first gallium composition ratio, the second nitride semiconductor layer has a second gallium composition ratio, and the third layer has a third gallium composition ratio greater than at least one of the first gallium composition ratio or the second gallium composition ratio.

The third gallium composition ratio may be greater than the first gallium composition ratio and the second gallium composition ratio. The second gallium composition ratio may be greater than the first gallium composition ratio.

Additionally, a difference between the third gallium composition ratio and the first gallium composition ratio may be greater than a difference between the first gallium composition ratio and the second composition ratio. Also, a difference between the third gallium composition ratio and second first gallium composition ratio may be greater than a difference between the first gallium composition ratio and the second composition ratio.

Additionally, the third layer may be thicker than each of the first nitride semiconductor layer and the second nitride semiconductor layer. Also, the first and second nitride semiconductor layers may have substantially a same thickness.

Additionally, the first gallium composition ratio may be substantially equal to the second gallium composition ratio, and the first nitride semiconductor layer and the second nitride semiconductor layer may be different portions of a same layer. A silicon substrate may be coupled to the first nitride semiconductor layer.

Additionally, a fourth layer may be included between the third layer and the second nitride semiconductor layer, where the fourth layer has at least one property that at least partially offsets or compensates for a tensile stress component generated by the third layer.

The at least one property may be a material from which the fourth layer is made. The material may be, for example, $Al_{a2}In_{b2}Ga_{1-a2-b2}N$ ($0 < a2 \leq 1$, $0 \leq b2 \leq 1$, $a2 \neq a1$, $a2 \neq 0$).

The at least one property may be a gallium composition ratio, and the gallium composition ratio of the fourth layer is less than at least one of the first or second gallium composition ratios. The gallium composition ratio of the fourth layer may be less than the first and second gallium composition ratios.

The at least one property may be an aluminum composition ratio, and the aluminum composition ratio of the fourth layer is greater than at least one of an aluminum composition ratio of the first nitride semiconductor layer, an aluminum composition ratio of the second nitride semiconductor layer, or an overall average aluminum composition ratio of the first and second nitride semiconductor layers.

The at least one property may be a thickness of the fourth layer, and the thickness of the fourth layer is less than a thickness of the third layer.

The at least one property of the fourth layer may allow the second nitride semiconductor layer to have greater compression stress than tensile stress.

The at least one property of the fourth layer allows the structure to have a net compressive stress.

In accordance with another embodiment, a method of manufacturing a semiconductor buffer structure, the method including: forming a first nitride semiconductor layer on a silicon substrate; forming a dislocation control layer made from $Al_{a1}In_{b1}Ga_{1-a1-b1}N$ ($0 \leq a1 < 1$, $0 \leq b1 < 1$, $a1+b1 \neq 1$) on the first nitride semiconductor layer; and formforming a second nitride semiconductor layer on the dislocation control layer, wherein an average gallium composition ratio of each of the first and second nitride semiconductor layers increases in one direction, the average gallium composition ratio of the second nitride semiconductor layer is higher than the average gallium composition ratio of the first nitride semiconductor layer, and the dislocation control layer reduces the overall dislocation density of the first and second nitride semiconductor layers.

An average gallium composition ratio of the dislocation control layer may be higher than the average gallium composition ratio of each of the first and second nitride semiconductor layers.

The method may further include: forming a stress control layer made from $Al_{a2}In_{b2}Ga_{1-a2-b2}N$ ($0 \leq a2$, $b2 \leq 1$, $a2 \neq a1$, $a2 \neq 0$) on the dislocation control layer, wherein the stress control layer offsets a reduction in a compression stress of the semiconductor buffer structure.

An average gallium composition ratio of the stress control layer may be lower than the average gallium composition ratio of the first nitride semiconductor layers.

In accordance with another embodiment, a method of manufacturing a semiconductor device, the method including: forming a semiconductor buffer structure by using the above-described method; forming a nitride stack structure on the semiconductor buffer structure; and removing the semiconductor buffer structure from the nitride stack structure.

DETAILED DESCRIPTION

Figure 1:
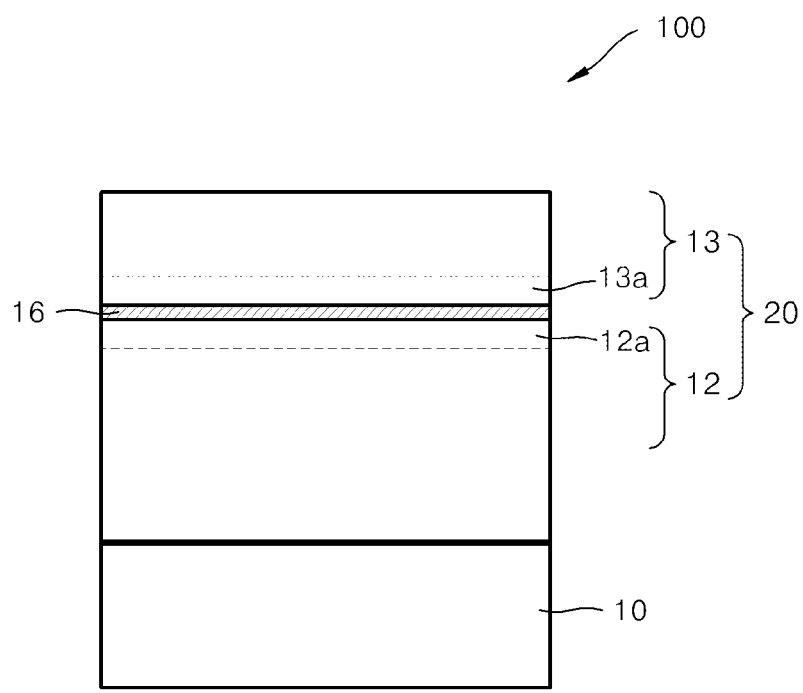
FIG. 1 shows one embodiment of a semiconductor buffer structure.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those of ordinary skill in the art.

In the drawings, it is understood that the thicknesses of layers and regions may be exaggerated for clarity. It will also be understood that when a layer is referred to as being "on" another layer or substrate, it can be directly on the other layer or substrate or intervening layers may also be present. Like reference numerals in the drawings denote like elements, and thus their description will not be repeated. As used herein, the term "and/or" includes any and all combinations of one or more of the associated listed items. Expressions such as "at least one of," when preceding a list of elements, modify the entire list of elements and do not modify the individual elements of the list.

Additionally, for one or more embodiments disclosed herein, a "layer" may refer to a section in which a composition ratio of a gallium component (hereinafter, referred to as a "gallium composition ratio") varies without an inflection point. A gallium composition ratio may refer to a proportion of the gallium component present in a nitride semiconductor layer, which may have the same or a different height as silicon substrate 10. In addition, an average gallium composition ratio may refer to a proportion of a gallium component in a single nitride semiconductor layer.

FIG. 1 shows one embodiment of a semiconductor buffer structure 100 which includes a silicon substrate 10 and a buffer layer 20 formed on the silicon substrate. The silicon substrate 10 may be a substrate having a Si crystalline surface with any one of a number of orientations, e.g., 100, 110, 111, etc.

The buffer layer 20 may be used, for example, as a layer for growing a nitride semiconductor. In this embodiment, the buffer layer 20 includes first and second buffer layers 12 and 13, each of which may include one or more nitride semiconductor layers. The one or more nitride semiconductor layers in each buffer layer may be formed of a material which, for example, includes $Al_{x1}In_{y1}Ga_{1-x1-y1}N$ ($0 \le x1 \le 1$, $0 \le y1 < 1$, and $0 \le x1+y1 \le 1$). Also, a layer of buffer layer 20 that directly contacts the silicon substrate 10 may be formed of a material which includes AlN and/or an uppermost layer of the buffer layer 20 may be formed of a material which includes GaN. In other embodiments, different materials may be used.

A number of factors may be taken into consideration in determining the overall stress of buffer layer 20. These factors include the number of nitride semiconductor layers, the thickness of each nitride semiconductor layer, and/or a composition ratio of components in the buffer layer. In the present embodiment, the number of nitride semiconductor layers, the thickness of each nitride semiconductor layer, and the composition ratio of components may be determined in such a way that the overall stress of the buffer layer 20 constitutes a compression stress.

In accordance with one embodiment, the average gallium composition ratios of the nitride semiconductor layers increase with increasing distance from the silicon substrate. Additionally, the thickness of each nitride semiconductor layer may be the same or different. According to one example, nitride semiconductor layers included in FIG. 1 may have a thickness lying in a range between about 10 nm to about 1 μm.

When nitride semiconductor layers with higher average gallium composition ratios are formed farther away from silicon substrate 10, dislocation density may increase in the device even though the overall stress of buffer layer 20 is compression stress (as opposed to tensile stress which may promote the formation of cracks). In accordance with one embodiment, to compensate for any increase in dislocation density that may occur, a dislocation control layer 16 may be disposed between adjacent or neighboring nitride semiconductor layers 12a and 13a. (Layers 12a and 13a are shown as being included in first and second buffer layers, respective; in other embodiments, layers 12a and 13a may be formed separately or distinctly from these buffer layers). The addition of dislocation control layer 16 may reduce the dislocation density of buffer layer 20 to produce a more dependable a reliable device.

In the embodiment of FIG. 1, the dislocation control layer 16 is disposed between neighboring nitride semiconductor layers 12a and 13a within buffer layer 20. The dislocation control layer may be formed from various materials. According to one implementation, the dislocation control layer may be formed of a material which includes $Al_{a1}In_{b1}G_{1-a1-b1}N$ ($0 \le a1 < 1$, $0 \le b1 < 1$, $a1+b1 \ne 1$). Also, an average gallium composition ratio of dislocation control layer 16 may be higher than an average gallium composition ratio of each of the nitride semiconductor layers 12a and 13a. Also, according to one non-limiting example, the dislocation control layer 16 is a single crystal layer formed of GaN.

Although the dislocation control layer 16 is disposed in the buffer layer 20, it may be suitable for some applications to ensure that the overall stress of the buffer layer 20 is compression stress (as opposed to tensile stress). Accordingly, in one embodiment, the thickness of the dislocation control layer 16 may be controlled or set so that compression stress is applied to the buffer layer 20.

For example, as previously indicated, because the overall stress of the buffer layer may vary according to the number of nitride semiconductor layers, the thickness of each nitride semiconductor layer, and/or a composition ratio of components in the nitride of buffer layers, the thickness of the dislocation control layer 16 may lie in a range between about 0.1 nm and about 100 nm for some applications as a way of allowing compression stress to form. (In other applications, which, for example, have a different number or thickness of nitride semiconductor layers or component composition ratios, the thickness of the dislocation control layer may lie in a different range).

Additionally, the gallium composition ratio of the dislocation control layer may be controlled or set to reduce dislocation density. In one implementation, the dislocation control layer 16 may be formed to have a gallium composition ratio higher than the average gallium composition of each of nitride semiconductor layers 12a and 13a.

The inclusion of dislocation control layer 16 may also allow for an offset to take place which reduces dislocation density. controlled or setin this manner, a direction of dislocation that occurs in the one or more layers of nitride semiconductor layer 12 disposed on one side of the dislocation control layer 16 is opposite to direction of dislocation that occurs in one or more layer of nitride semiconductor layer 13 disposed on the other side with respect to the dislocation control layer 16. Thus, the dislocations having opposite directions offset each other and, thus, the overall dislocation density of buffer layer 20 may be reduced.

Figure 2:
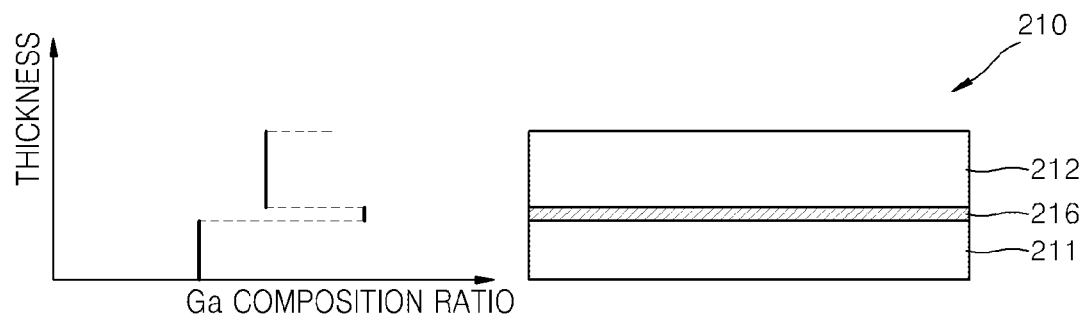
FIG. 2 shows another embodiment of a bufferlayer.

FIG. 2 shows an embodiment of a buffer layer 210 that includes a dislocation control layer 216 between two nitride semiconductor layers 211 and 212. In other embodiments, buffer layer 210 may have a different number of nitride semiconductor layers and/or multiple dislocation control layers.

The two nitride semiconductor layers 211 and 212 may be formed, for example, of single crystal having a uniform gallium composition ratio irrespective of height or thickness. An average gallium composition ratio of the second nitride semiconductor layer 212 is higher than an average gallium composition ratio of the first nitride semiconductor layer 211. As a result, the average gallium composition ratios of the nitride semiconductor layers in buffer layer 210 may increase in step form (as shown). Thicknesses of the first nitride semiconductor layer 211 and the second nitride semiconductor layer 212 may be the same or different.

As shown, dislocation control layer 216 is disposed between the first nitride semiconductor layer 211 and the second nitride semiconductor layer 212. An average gallium composition ratio of the dislocation control layer is higher than an overall average gallium composition ratio of the first nitride semiconductor layer 211 and the second nitride semiconductor layer 212. Alternatively, the average gallium composition ratio of dislocation control layer 216 may be higher than the average gallium composition ratio of only one of the two nitride semiconductor layers, e.g., second nitride semiconductor layer 212. The dislocation control layer 216 may be formed of GaN or another material.

The thickness of dislocation control layer 216 may be set so that a compression stress is applied to a layer above the dislocation control layer 216 (e.g., second nitride semiconductor layer 212) compared to the first nitride semiconductor layer 211 and dislocation control layer 216. (These underlying layers 216 and 11 may be subject to a different level of the same stress or a different type of stress, e.g., tensile stress). Such a thickness of the dislocation control layer 216 may be smaller than the thicknesses of either or both of the first nitride semiconductor layer 211 and the second nitride semiconductor layer 212.

Figure 3:
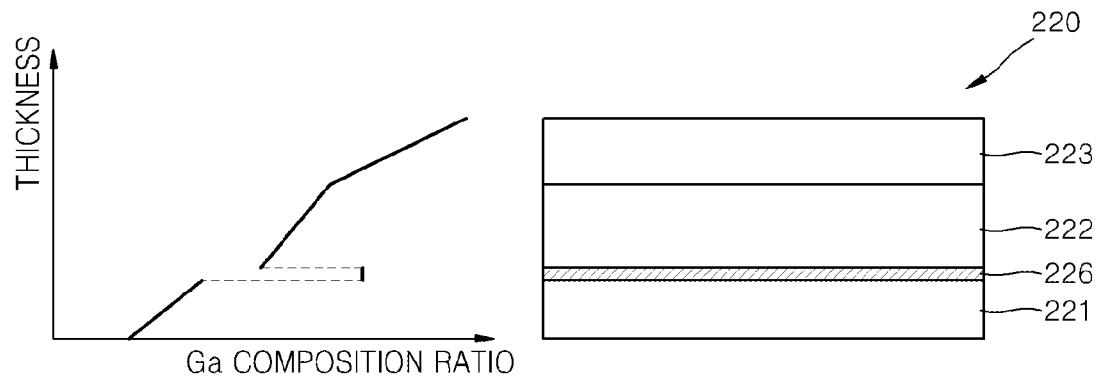
FIG. 3 shows another embodiment of a bufferlayer.

FIG. 3 shows another embodiment of a buffer structure. In this structure, a buffer layer 220 includes three nitride semiconductor layers 221, 222, and 223 and one dislocation control layer 226.

The three nitride semiconductor layers 221, 222, and 223 may be formed of polycrystalline having a gallium composition ratio which increases in a predetermined direction, e.g., in a vertically increasing direction. For example, as shown, the average gallium composition ratios of nitride semiconductor layers 221, 222, and 223 progressively increase. Thicknesses of the nitride semiconductor layers 221, 222, and 223 may be the same or different.

As shown, the dislocation control layer 226 is disposed between the first nitride semiconductor layer 221 and the second nitride semiconductor layer 222. An average gallium composition ratio of the dislocation control layer 226 may be higher than an average gallium composition ratio of each of the first and second nitride semiconductor layers 221 and 222.

In another embodiment, the average gallium composition ratio of the dislocation control layer may be higher than an overall average gallium composition ratio of all three nitride semiconductor layers 221, 222, and 223.

Also, the gallium composition ratio of the dislocation control layer 226 may be higher than a gallium composition ratio of the first nitride semiconductor layer 221 at a boundary between the dislocation control layer 226 and the first nitride semiconductor layer 221.

Also, the gallium composition ratio of the dislocation control layer 226 may be higher than a gallium composition ratio of the second nitride semiconductor layer 222 at a boundary between the dislocation control layer 226 and the second nitride semiconductor layer 222. The dislocation control layer 226 may be formed of various materials, e.g., GaN.

The thickness of the dislocation control layer 226 may be controlled or set so that a compression stress is applied to one or more layers above the dislocation control layer 226 (e.g., at least second nitride semiconductor layer 222). A different level of the same stress or a different type of stress may be applied to the underlying first nitride semiconductor layer 221 and dislocation control layer 226. Such a thickness of the dislocation control layer 226 may be smaller than thicknesses of the first nitride semiconductor layer 221 and the second nitride semiconductor layer 222. In other embodiments, the dislocation control layer thickness may be greater than either or both of layers 221 and 222 depending, for example, on the application.

Figure 4:
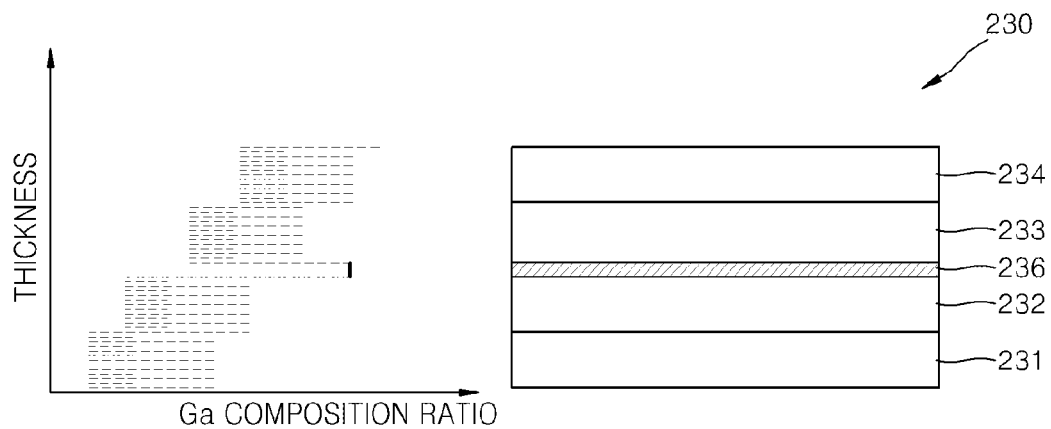
FIG. 4 shows another embodiment of a bufferlayer.

FIG. 4 shows another embodiment of a buffer structure 230 that includes four nitride semiconductor layers 231, 232, 233, and 234 and one dislocation control layer 236 located between at least two of these nitride semiconductor layers.

The four nitride semiconductor layers 231, 232, 233, and 234 may be formed of a super lattice, and an average gallium composition ratio of each of the four nitride semiconductor layers may increase in a predetermined direction, e.g., in a vertically increasing direction. Thicknesses of nitride semiconductor layers 231, 232, 233, and 234 may be the same or different.

As shown, the dislocation control layer 236 is disposed between second nitride semiconductor layer 232 and third nitride semiconductor layer 233. An average gallium composition ratio of dislocation control layer 236 may be higher than an average gallium composition ratio of each of the second and third nitride semiconductor layers 232 and 233 contacting the dislocation control layer 236, or may be higher than an overall average gallium composition ratio of all four nitride semiconductor layers 231, 232, 233, and 234.

In addition, a gallium composition ratio of dislocation control layer 226 may be higher than a gallium composition ratio of the second nitride semiconductor layer 232 at a boundary between dislocation control layer 236 and second nitride semiconductor layer 232. In addition, a gallium composition ratio of dislocation control layer 226 may be higher than a gallium composition ratio of third nitride semiconductor layer 233 at a boundary between dislocation control layer 236 and third nitride semiconductor layer 233. The dislocation control layer 236 may be formed from various materials including, for example, GaN.

A thickness of dislocation control layer 236 may be controlled or setso that a compression stress is applied to one or more layers above the dislocation control layer (e.g., at least third nitride semiconductor layer 233). The first and second nitride semiconductor layers 231 and 232 and the dislocation control layer 236 may have different levels of the same stress or may be subject to a different type of stress.

In one embodiment, the thickness of dislocation control layer 236 may be smaller than the thicknesses of the second and third nitride semiconductor layers 232 and 233. For example, the thickness of the dislocation control layer 236 may lie in a range between about 0.1 nm and about 100 nm.

In one or more of the foregoing embodiments, the plurality of nitride semiconductor layers have average gallium composition ratios that increase with increasing distance from a silicon substrate. This may allow a compression stress to be generated in all or a portion of the layers of the bufferlayer. Furthermore, at least one dislocation control layer having a higher average gallium composition ratio than either or both of its neighboring nitride semiconductor layers may prevent a large dislocation density from forming and/or cracks from occurring.

In other embodiments, multiple dislocation control layers may be included in the bufferlayer, with each dislocation control layer being formed between a different pair of adjacent nitride semiconductor layers. This may have the effect of further preventing the formation of a large dislocation density in the overall bufferlayer.

Figure 5:
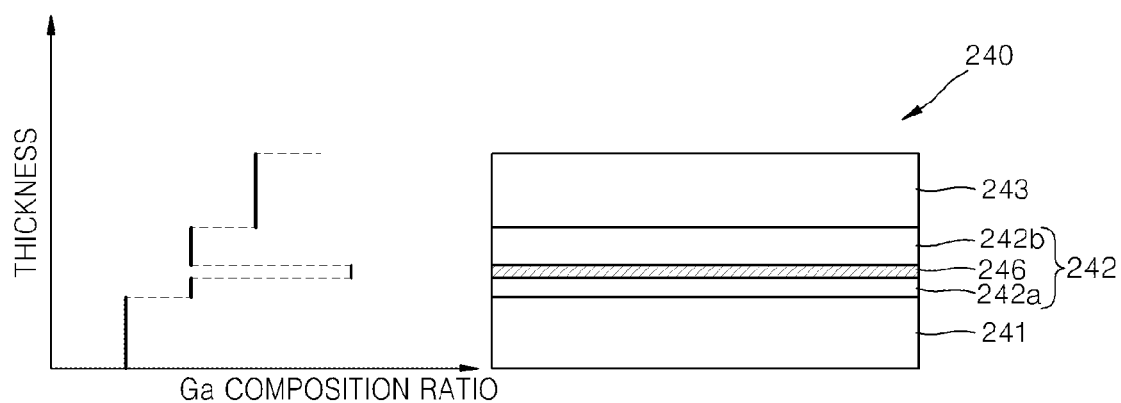
FIG. 5 shows another embodiment of a semiconductor device.

FIG. 5 shows another embodiment of a buffer layer 240 which includes three nitride semiconductor layers 241, 242, and 243, and the one dislocation control layer 246 which may be considered to be between different portions of a same nitride semiconductor layer or, alternatively, which may be considered to be between two adjacent ones of the nitride semiconductor layers.

Each of the first through third nitride semiconductor layers 241, 242, and 243 may be formed, for example, of single crystal having a uniform gallium composition ratio that is independent of height or thickness. As shown, the average gallium composition ratio increases from the first nitride semiconductor layer 241 to the third nitride semiconductor layer 243. That is, according to one implementation, an average gallium composition ratio of second nitride semiconductor layer 242 may be higher than an average gallium composition ratio of first nitride semiconductor layer 241, and an average gallium composition ratio of third nitride semiconductor layer 243 may be higher than the an average gallium composition ratio of second nitride semiconductor layer 242.

The dislocation control layer 246 has a high average gallium composition ratio and may be formed in the second nitride semiconductor layer 242. (Alternatively, the dislocation control layer may be considered to be between two layers 242a and 242b that are separate but which have substantially the same average gallium composition ratio).

In this embodiment, an average gallium composition ratio of dislocation control layer 246 is higher than an overall average gallium composition ratio of all three nitride semiconductor layers 241, 242, and 243. In other embodiments, one or more of the nitride semiconductor layers may have an average gallium composition ratio greater than the average gallium composition ratio of the dislocation control layer. For example, the dislocation control layer may have an average gallium composition ratio greater than at least third nitride semiconductor layer 243. The dislocation control layer 246 may be formed from various materials including, for example, GaN.

The thickness of the dislocation control layer 246 may be controlled or setor set so that a compression stress is applied to one or more layers above the dislocation control layer 246, e.g., at least portion 242b of the second nitride semiconductor layer 242. The layers under portion 242b including dislocation control layer 246, portion 242a of the second nitride semiconductor layer, and first nitride semiconductor layer 241 may have a different level of the same stress or a different type of stress (e.g., tensile stress).

Figure 6:
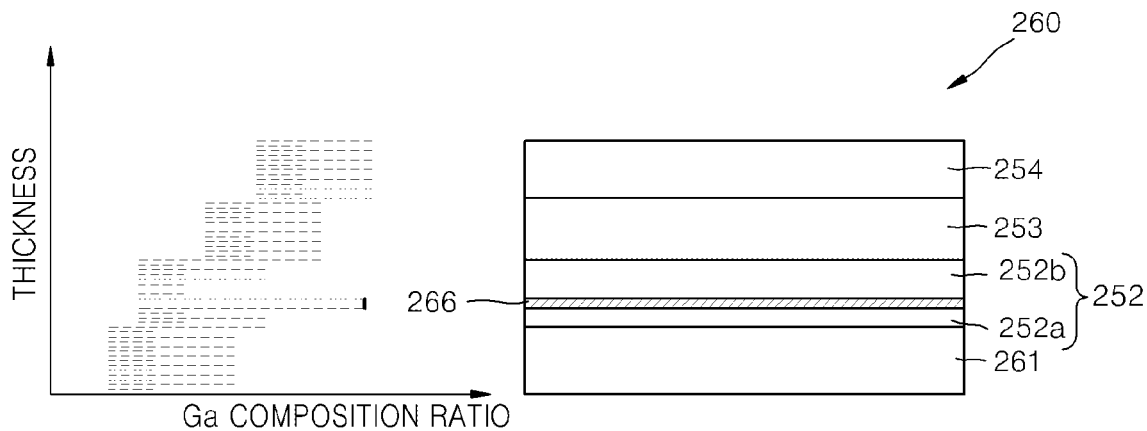
FIG. 6 shows another embodiment of a semiconductor device.

FIG. 6 shows another embodiment of a buffer layer 250 which includes four nitride semiconductor layers 251, 252, 253, and 254 and one dislocation control layer 256 which may be considered to be between different portions of a same nitride semiconductor layer or, alternatively, which may be considered to be between two adjacent ones of the nitride semiconductor layers.

Each of the four nitride semiconductor layers 251, 252, 253, and 254 may be formed of, for example, a super lattice, and an average gallium composition ratio of the four nitride semiconductor layers 251, 252, 253, and 254 may increase in a predetermined direction, e.g., from first nitride semiconductor layer 251 to fourth nitride semiconductor layer 254.

The dislocation control layer 256 may be considered to be formed within the second nitride semiconductor layer 252, such that a first portion 252a of the second nitride semiconductor layer is below the dislocation control layer and a second portion 252b of the second nitride semiconductor layer is above the dislocation control layer. Alternatively, the dislocation control layer may be considered to be between two nitride semiconductor layers having substantially a same average gallium composition ratio.

In this embodiment, an average gallium composition ratio of dislocation control layer 256 is higher than an overall average gallium composition ratio of all four nitride semiconductor layers 251, 252, 253, and 254. Alternatively, the average gallium composition ratio of one or more of the nitride semiconductor layers may be higher than the average gallium composition ratio of the dislocation control layer, e.g., the average gallium composition ratio of the dislocation control layer may be higher than at least third nitride semiconductor layer 253. The dislocation control layer 256 may be formed of materials which include, for example, GaN.

The thickness of the dislocation control layer 256 may be controlled or set so that a compression stress is formed in one or more layers above the dislocation control layer 256 including at least portion 252b of the second nitride semiconductor layer 252. The layers below portion 252b may be subject to a different level of the same stress or a different type of stress.

Additionally, a reduction in dislocation density may be achieved or maximized by increasing a thickness of the dislocation control layer having a relatively high average gallium composition ratio, as indicated in the aforementioned embodiments.

However, when the thickness of the dislocation control is increased, compression stress experienced by a nitride semiconductor layer disposed on one side of the dislocation control layer may not transfer to a nitride semiconductor layer disposed on the other side of the dislocation control layer. Moreover, a tensile stress may even be applied in some cases. In accordance with one or more embodiments, a stress control layer may therefore be included to compensate for a reduction compression stress (or even the formation of tensile stress) caused by the dislocation control layer.

Figure 7:
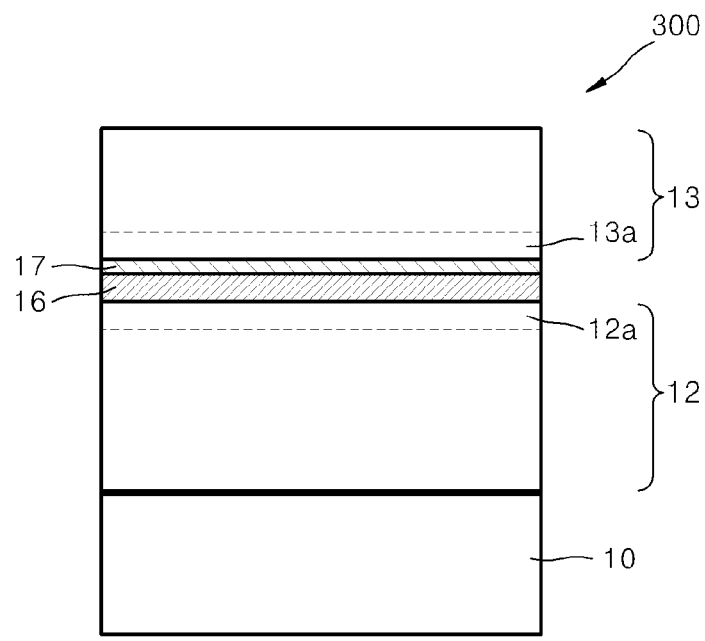
FIG. 7 shows an embodiment of a buffer structure with a stress control layer.

FIG. 7 shows one embodiment of a semiconductor buffer structure 300 which has a stress control layer 17 included to compensate for a reduction in compression stress due to dislocation control layer 16. The stress control layer 17 may be formed of $Al_{a2}In_{b2}Ga_{1-a2-b2}N$ ($0<a2\leq1$, $0\leq b2\leq1$, $a2\neq a1$, $a2\neq0$). In this embodiment, the stress control layer 17 is disposed between the dislocation control layer 16 and nitride semiconductor layer 13 having a predetermined or high gallium composition ratio. (In this above compound, In refers to indium).

The average gallium composition ratio of the stress control layer 17 may be lower than an overall average gallium composition ratio of the plurality of nitride semiconductor layers 12 and 13 or may be lower than an average gallium composition ratio of nitride semiconductor layer 12a contacting the dislocation control layer 16.

Alternatively, an average aluminum composition ratio of the stress control layer 17 may be higher than an overall average aluminum composition ratio of the plurality of nitride semiconductor layers 12 and 13 or may be higher than an average aluminum composition ratio of the nitride semiconductor layer 12a contacting the dislocation control layer 16. The stress control layer 17 may be formed of single crystal, for example, AlN.

Also, a thickness of the stress control layer 17 may be controlled or set so that an overall stress of buffer layer 20 (including layers 12 and 13) may be a compression stress. The thickness of stress control layer 17 may be less than a thickness of dislocation control layer 16. For example, when the thickness of dislocation control layer 16 is between about 10 nm and about 2000 nm, the thickness of stress control layer 17 may be between about 1 nm and about 1000 nm.

Accordingly, although a tensile stress may be applied to the stress control layer 17 due to the dislocation control layer 16, a compression stress greater than the tensile stress may be applied to the nitride semiconductor layer 13a as a result of the stress control layer 17.

Figure 8:
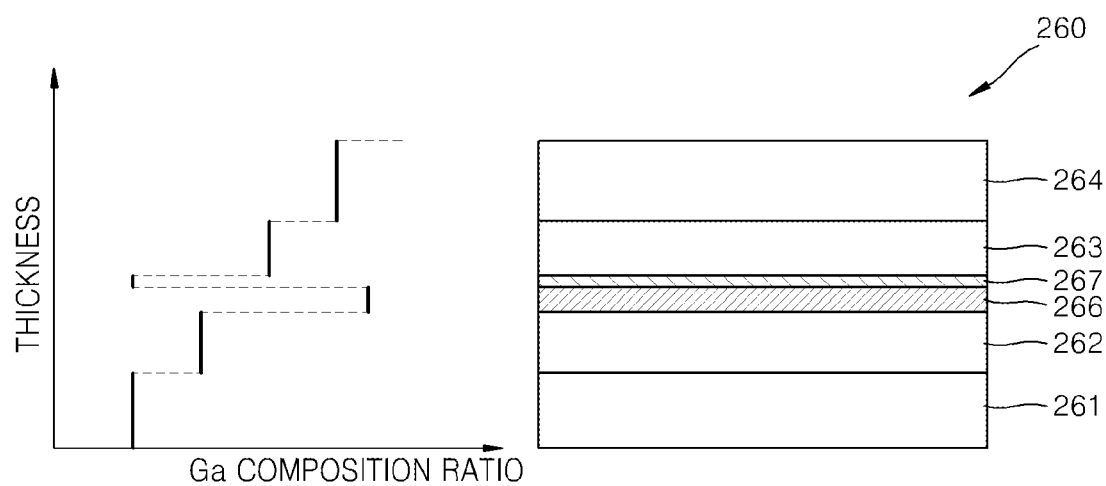
FIG. 8 shows an embodiment of a buffer layer with a stress control layer.

FIG. 8 shows another embodiment of a buffer layer 260 which includes four nitride semiconductor layers 261, 262, 263, and 264, a dislocation control layer 266, and a stress control layer 267.

The four nitride semiconductor layers 261, 262, 263, and 264 may be formed of single crystal having a uniform gallium composition ratio irrespective or independent of height or thickness. Also, as shown, an average gallium composition ratio increases step-by-step from the first nitride semiconductor layer 261 to the fourth nitride semiconductor layer 264. Thicknesses of the first through fourth semiconductor layers may be the same or different.

The dislocation control layer 266 has a relatively high average gallium composition ratio and may be formed between the second and third nitride semiconductor layers 262 and 263. The stress control layer 267 having a relatively low average gallium composition ratio may be formed, directly or indirectly, on the dislocation control layer 266.

In one embodiment, an average gallium composition ratio of the dislocation control layer 266 may be higher than an average gallium composition ratio of third nitride semiconductor layer 263. An average gallium composition ratio of stress control layer 267 may be lower than an average gallium composition ratio of the second nitride semiconductor layer 262. The dislocation control layer 266 may be formed from materials which include GaN, and the stress control layer 267 may be formed from materials which include AlN.

A thickness of the stress control layer 267 may be controlled or set so that a compression stress may be formed in layers disposed on or above the stress control layer 267, e.g., the third and fourth nitride semiconductor layers 263 and 264. In one embodiment, the thickness of the stress control layer 267 may be smaller than a thickness of the dislocation control layer 266. However, in other embodiments, the stress control layer may have a different thickness.

In this structure a compression stress may be applied to the dislocation control layer 266 due to the first and second semiconductor layers 261 and 262, and a tensile stress may be applied to the stress control layer 267 due to the dislocation control layer 266. However, the compression stress may be greater than the tensile stress applied to the third nitride semiconductor layer 263. In this case and because of the presence of the stress control layer, a net compression stress is applied to the third nitride semiconductor layer 263 contacting the stress control layer 267, due to the compression stress in the first and second semiconductor layers 261 and 262 and dislocation control layer 266 located under third nitride semiconductor layer 263.

The above-described stress control layer 17 may be applied to the buffer layers 210, 220, 230, 240, and 250 in the embodiments shown in FIGS. 2 through 6. When applied in this manner, stress control layer 17 may, for example, be formed on dislocation control layers 216, 226, 236, 246 and 256, either directly or indirectly.

Further, as described above, a nitride semiconductor layer included in a buffer layer may be a single crystal layer having a uniform gallium composition ratio, a polycrystalline layer having a varying gallium composition ratio, or a super lattice layer having an alternately varying gallium composition ratio. In addition, a buffer layer may be formed based on a combination of any of the following: a single crystal nitride semiconductor layer, a polycrystalline semiconductor layer, or a super lattice nitride semiconductor layer. Additionally, a nitride semiconductor layers may be disposed to have progressively higher average gallium composition ratios with increasing distance from an underlying silicon substrate.

Although many of the foregoing embodiments have one dislocation control layer and one stress control layer, in other embodiments multiple dislocation control layers and/or multiple stress control layers may be included, where each dislocation control layer is formed between different nitride semiconductor layers or portions and each stress control layer is coupled to one or more dislocation control layers. For example, in one embodiment, one dislocation control layer may be situated between two stress control layers or one stress control layer may be situated between two dislocation control layers.

Figure 9:
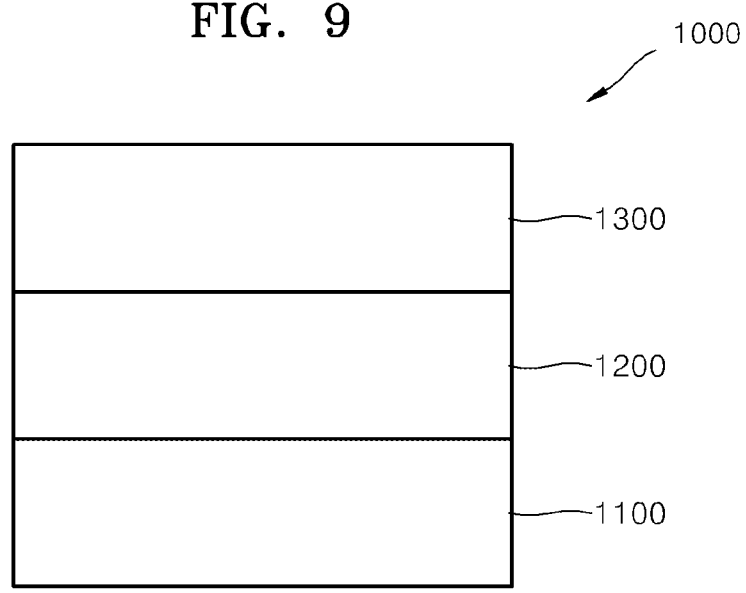
FIG. 9 shows another embodiment of a semiconductor device.
Figure 10:
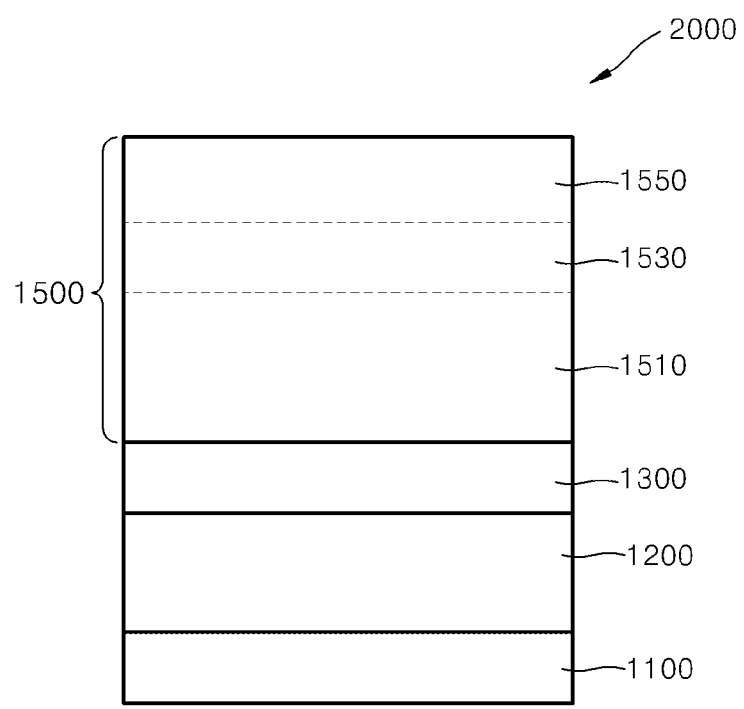
FIG. 10 shows another embodiment of a semiconductor device.

FIG. 9 shows an embodiment of a semiconductor device 1000 which includes a silicon substrate 1100, a buffer layer 1200 formed on the silicon substrate 1100, and a nitride stack structure 1300 formed on the buffer layer 1200. In this device, the semiconductor buffer structure may include a buffer layer or buffer structure in accordance with any of the aforementioned embodiments.

With such a buffer layer or structure, the device may demonstrate a reduction in dislocation density while simultaneously preventing or reducing the formation of tensile stress in favor of compression stress. Consequently, the nitride stack structure may experience few cracks or defects during manufacture or subsequent use. Accordingly, semiconductor device 1000 may be manufactured in the form of a wafer having a large area.

More specifically, when the nitride stack structure 1300 is grown on the silicon substrate 1100, the buffer layer 1200 may compensate for tensile stress generated due to a thermal expansion coefficient difference and may employ the above-described buffer layers 210, 220, 230, 240, and 250. In addition, a gallium composition ratio of the uppermost layer of the buffer layer may have a smaller value than a gallium composition ratio of the nitride stack structure 1300.

The nitride stack structure 1300 may include at least one nitride semiconductor layer. The nitride semiconductor layer included in the nitride stack structure 1300 may be different from a nitride semiconductor layer included in the buffer layer 1200 in terms of one or more of composition ratio such as gallium, thickness, or temperature during a manufacturing process.

The at least one nitride semiconductor layer may be grown on the silicon substrate 1100 and may be formed of, for example, nitride containing gallium. The at least one nitride semiconductor layer may be formed, for example, of $Al_{x2}In_{y2}Ga_{1-x2-y2}N$ ($0 \leq x2 \leq 1$, $0 \leq y2 \leq 1$, $x2+y2<1$). For example, the at least one nitride semiconductor layer may be formed of one of GaN, InGaN, or AlInGaN. Alternatively, the at least one nitride semiconductor layer may be formed of nitride not containing aluminum. Also, the at least one nitride semiconductor layer may be selectively undoped or doped.

Additionally, the silicon substrate 1100 may be removed during or after manufacture of the semiconductor device 1000. The semiconductor device 1000 may be applied to a light-emitting diode (LED), a Schottky diode, a laser diode (LD), a field effect transistor (FET) or a power device. Moreover, according to one embodiment, semiconductor device 1000 may be used as a template for an LED, the a Schottky diode, a LD, a FET, or a high electron mobility transistor (HEMT).

FIG. 16 shows an embodiment of another semiconductor device 2000 which includes silicon substrate 1100, buffer layer 1200 formed on silicon substrate 1100, nitride stack structure 1300 formed on buffer layer 1200, and a device layer 1500 formed on the nitride stack structure.

The device layer 1500 includes a first-type semiconductor layer 1510, an active layer 1530, and a second type semiconductor layer 1550. The first-type semiconductor layer 1510 may be a semiconductor layer doped with first-type impurities and may be formed of a group V nitride semiconductor material, e.g., a semiconductor material including $Al_xGa_yIn_zN$ ($0 \le x \le 1$, $0 \le y \le 1$, $0 \le z \le 1$, $x+y+z=1$) doped with n-type impurities. Examples of the n-type impurities may include silicon (Si), germanium (Ge), selenium (Se), and tellurium (Te).

The second-type semiconductor layer 1550 is a semiconductor layer doped with second-type impurities and may be formed of a group III-V nitride semiconductor material, e.g., a semiconductor material including $Al_xGa_yIn_zN$ ($0 \le x \le 1$, $0 \le y \le 1$, $0 \le z \le 1$, $x+y+z=1$) doped with p-type impurities. Examples of the p-type impurities may include magnesium (Mg), zinc (Zn), and beryllium (Be).

The active layer 1530 is a layer that emits light by a combination between electrons and holes. Here, the light is emitted by as much energy corresponding to an energy band gap of the active layer 1530. The active layer 1530 may have a single quantum well structure or a multi quantum well structure, which is formed by periodically changing values x, y, and z of $Al_xGa_yIn_zN$ to adjust a band gap.

For example, a quantum well structure may include a pair of a quantum well and a barrier layer having a structure such as InGaN/GaN, InGaN/InGaN, InGaN/AlGaN, or InGaN/InAlGaN. According to a molar fraction of indium (In) in the InGaN layer, band gap energy may be controlled or set to adjust a light emitting wavelength band. In general, when a mole fraction of In is changed by as much 1%, a light emitting wavelength is shifted by about 5 nm.

The first type semiconductor layer 1510 and the second type semiconductor layer 1550 may each have a single layer structure, or alternatively, may have a multi-layer structure.

Thus far, the case where the device layer 1500 is an LED structure has been described. In addition, the device layer 1500 may include an LD, a FET, an HEMT, or a Schottky diode.

A semiconductor buffer structure according to one or more of the aforementioned embodiments may reduce a dislocation density and cracks by placing a layer having a high gallium composition ratio in between a plurality of layers. Further, when a nitride semiconductor thin film grows on the above-described semiconductor buffer structure, since cracks are reduced in the nitride semiconductor thin film, a large size semiconductor device may be manufactured using a silicon substrate.

Next, a method of manufacturing a semiconductor buffer structure according to an embodiment of the present invention will now be described. The method of the semiconductor buffer structure of FIG. 1 will now be described.

The buffer layer 20 is formed on the silicon substrate 10. In more detail, the nitride semiconductor layer 12 is formed on the silicon substrate 10, the dislocation control layer 16 made from $Al_{a1}In_{b1}Ga_{1-a1-b1}N$ ($0 \le a1 < 1$, $0 \le b1 < 1$, $a1+b1 \ne 1$) is formed on the nitride semiconductor layer 12, and the nitride semiconductor layer 13 is formed on the dislocation control layer 16. An average gallium composition ratio of each of the nitride semiconductor layers 12 and 13 increases in one direction, the average gallium composition ratio of the nitride semiconductor layer 13 is higher than the average gallium composition ratio of the nitride semiconductor layer 12, and the dislocation control layer 16 reduces the overall dislocation density of the nitride semiconductor layers 12 and 13.

In addition, an average gallium composition ratio of the dislocation control layer 16 may be higher than the average gallium composition ratio of each of the nitride semiconductor layers 12 and 13. Besides, the characteristics of the nitride semiconductor layers 12 and 13 and the dislocation control layer 16 are described above, and thus detailed descriptions thereof are omitted here.

Meanwhile, the semiconductor buffer structure of FIG. 7 may be manufactured by further including an operation of forming the stress control layer 17 made from $Al_{a2}In_{b2}Ga_{1-a2-b2}N$ ($0 \le a2$, $b2 \le 1$, $a2 \ne a1$, $a2 \ne 0$) on the dislocation control layer 16. The stress control layer 17 may compensate for a reduction in a compression stress of a buffer layer. An average gallium composition ratio of the stress control layer 17 may be lower than an average gallium composition ratio of a first nitride semiconductor layer. The other characteristics of the stress control layer 17 are described above, and thus detailed descriptions thereof are omitted here.

In addition, another buffer layer including the stress control layer 17 may be manufactured by using the same method as the method of manufacturing the buffer layer of FIG. 7, and thus a detailed description thereof is omitted here. A method of manufacturing the semiconductor device of FIG. 9 forms the buffer layer 1200 formed on the silicon layer 1100 and forms the nitride stack structure 1300 formed on the buffer layer 1200. The above-manufactured semiconductor device 1000 includes the buffer layer 1200 having few cracks or defects on the silicon substrate 1100, and thus the semiconductor device 1000 may be manufactured in the form of a wafer having a large area. The characteristics of the buffer layer 1200 and the nitride stack structure 1300 are described above, and thus detailed descriptions thereof are omitted here.

The buffer layer 1200 as well as the silicon substrate 1100 may be removed during or after manufacture of the semiconductor device 1000. In detail, the silicon substrate 1100 and the buffer layer 1200 may be removed after forming the nitride stack structure 1300 on the buffer layer 1200, or after forming a support substrate (not figured) on the nitride stack structure 1300.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor buffer structure comprising:
a plurality of overlapping nitride semiconductor layers with increasing average gallium composition ratios; and
a dislocation control layer disposed between two neighboring nitride semiconductor layers, the two neighboring nitride semiconductor layers including gallium, from among the plurality of nitride semiconductor layers, wherein the dislocation control layer is made from a material which includes $Al_{a1}In_{b1}Ga_{1-a1-b1}N$ ($0 \leq a1 < 1$, $0 \leq b1 < 1$, $a1+b1 \neq 1$),
wherein a thickness of the dislocation control layer is smaller than a thickness of each of the two neighboring nitride semiconductor layers, and
an average gallium composition ratio of the dislocation control layer is higher than an average gallium composition ratio of each of the neighboring nitride semiconductor layers.

2. The semiconductor buffer structure of claim 1, wherein the average gallium composition ratio of the dislocation control layer is higher than the average gallium composition ratio of each of the neighboring nitride semiconductor layers in a boundary between the dislocation control layer and the neighboring nitride semiconductor layers.

3. The semiconductor buffer structure of claim 1, wherein the dislocation control layer comprises GaN.

4. The semiconductor buffer structure of claim 1, wherein the dislocation control layer has a thickness which causes compression stress in one or more of the plurality of nitride semiconductor layers and the dislocation control layer.

5. The semiconductor buffer structure of claim 1, wherein the dislocation control layer contacts at least one of the neighboring nitride semiconductor layers.

6. The semiconductor buffer structure of claim 1, further comprising:
a stress control layer disposed on the dislocation control layer,
wherein the stress control layer is formed of $Al_{a2}In_{b2}Ga_{1-a2-b2}N$ ($0 < a2 \leq 1$, $0 \leq b2 \leq 1$, $a2 \neq a1$), and offsets a reduction in a compression stress of the semiconductor buffer structure.

7. The semiconductor buffer structure of claim 6, wherein an average gallium composition ratio of the stress control layer is lower than an average gallium composition ratio of each of the neighboring nitride semiconductor layers.

8. The semiconductor buffer structure of claim 6, wherein an average aluminum composition ratio of the stress control layer is higher than an average aluminum composition ratio of each of the neighboring nitride semiconductor layers.

9. The semiconductor buffer structure of claim 6, wherein the stress control layer is disposed between a first nitride semiconductor layer having a high average gallium composition ratio from among the neighboring nitride semiconductor layers and the dislocation control layer.

10. The semiconductor buffer structure of claim 9, wherein a gallium composition ratio of the stress control layer at a boundary between the stress control layer and the dislocation control layer is lower than a gallium composition ratio of a nitride semiconductor layer having a low average gallium composition ratio from among the neighboring nitride semiconductor layers in a boundary between the nitride semiconductor layer and the dislocation control layer.

11. The semiconductor buffer structure of claim 6, wherein the stress control layer is formed of AlN.

12. The semiconductor buffer structure of claim 6, wherein the stress control layer has a thickness which causes a compression stress in at least one of the plurality of nitride semiconductor layers, the dislocation control layer, and the stress control layer.

13. The semiconductor buffer structure of claim 6, wherein a thickness of the stress control layer is smaller than a thickness of the dislocation control layer.

14. The semiconductor buffer structure of claim 1, further comprising:
a silicon substrate,
wherein the plurality of nitride semiconductor layers are disposed on the silicon substrate.

15. The semiconductor buffer structure of claim 14, wherein the average gallium composition ratios of the plurality of nitride semiconductor layers increase in a direction away from the silicon substrate.

16. A semiconductor device comprising:
the semiconductor buffer structure formed according to claim 1; and
a nitride stack structure formed on the semiconductor buffer structure.

17. The semiconductor device of claim 16, further comprising;
a device layer formed on the nitride stack structure.

18. A method of manufacturing a semiconductor buffer structure, the method comprising:
forming a first nitride semiconductor layer including gallium on a silicon substrate;
forming a dislocation control layer made from $Al_{a1}In_{b1}Ga_{1-a1-b1}N$ ($0 \leq a1 < 1$, $0 \leq b1 < 1$, $a1+b1 \neq 1$) directly on the first nitride semiconductor layer; and
forming a second nitride semiconductor layer including gallium directly on the dislocation control layer,
wherein an average gallium composition ratio of each of the first and second nitride semiconductor layers increases in one direction, the average gallium composition ratio of the second nitride semiconductor layer is higher than the average gallium composition ratio of the first nitride semiconductor layer, the dislocation control layer reduces the overall dislocation density of the first and second nitride semiconductor layers, and an average gallium composition ratio of the dislocation control layer is higher than an average gallium composition ratio of each of the first and second nitride semiconductor layers, and
wherein a thickness of the dislocation control layer is smaller than a thickness of each of the first and second nitride semiconductor layers.

19. The method of claim 18, further comprising: forming a stress control layer made from $Al_{a2}In_{b2}Ga_{1-a2-b2}N$ ($0 < a2 \leq 1$, $0 \leq b2 \leq 1$, $a2 \neq a1$) on the dislocation control layer, wherein the stress control layer offsets a reduction in a compression stress of the semiconductor buffer structure.

20. The method of claim 19, wherein an average gallium composition ratio of the stress control layer is lower than the average gallium composition ratio of the first nitride semiconductor layers.

21. A method of manufacturing a semiconductor device, the method comprising:
forming a semiconductor buffer structure by using the method of claim 18:
forming a nitride stack structure on the semiconductor buffer structure; and
removing the semiconductor buffer structure from the nitride stack structure.

* * * * *